United States Patent
Igarashi et al.

(10) Patent No.: US 7,211,336 B2
(45) Date of Patent: May 1, 2007

(54) ORGANIC ELECTROLUMINESCENT DEVICE

(75) Inventors: Tatsuya Igarashi, Kanagawa (JP); Toshihiro Ise, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 305 days.

(21) Appl. No.: 10/743,023

(22) Filed: Dec. 23, 2003

(65) Prior Publication Data
US 2004/0137268 A1 Jul. 15, 2004

(30) Foreign Application Priority Data
Dec. 27, 2002 (JP) .......................... P.2002-382453
Dec. 8, 2003 (JP) .......................... P.2003-408525

(51) Int. Cl.
*H01L 51/54* (2006.01)
*H05B 33/14* (2006.01)

(52) U.S. Cl. ...................... 428/690; 428/917; 313/504; 313/506; 257/102; 257/103; 257/E51.043; 257/E51.044

(58) Field of Classification Search ..................... None
See application file for complete search history.

(56) References Cited

U.S. PATENT DOCUMENTS

| | | | | |
|---|---|---|---|---|
| 5,846,666 A | * | 12/1998 | Hu et al. ..................... | 428/690 |
| 5,861,219 A | * | 1/1999 | Thompson et al. ......... | 428/690 |
| 6,420,057 B1 | * | 7/2002 | Ueda et al. ................ | 428/690 |
| 2002/0125818 A1 | * | 9/2002 | Sato et al. .................. | 313/504 |
| 2003/0218418 A9 | * | 11/2003 | Sato et al. .................. | 313/504 |

FOREIGN PATENT DOCUMENTS

JP 2002-305083 A 10/2002

* cited by examiner

*Primary Examiner*—Marie Yamnitzky
(74) *Attorney, Agent, or Firm*—Sughrue Mion, PLLC

(57) ABSTRACT

An organic electroluminescent device comprising: a pair of electrodes; and at least one organic compound layer between the pair of electrodes, the at least one organic compound layer including a light emitting layer, wherein the light emitting layer contains at least one host material and at least one luminescent material, and the host material is a compound represented by the formula (I) as defined herein.

15 Claims, No Drawings

ORGANIC ELECTROLUMINESCENT DEVICE

FIELD OF THE INVENTION

This invention relates to an organic electroluminescent device (hereinafter abbreviated as "OELD") capable of converting electrical energy into light to emit light. The OELD of the invention is suited for use in the fields of display devices, displays, backlights, light sources for illumination, recording, exposure or reading, signs or signboards, interior decorations, optical communications, and so forth.

BACKGROUND OF THE INVENTION

OELDs have been actively studied and developed because of their capabilities of emitting light of high brightness at a low driving voltage. An OELD generally comprises a pair of opposing electrodes having therebetween a light emitting layer or a plurality of organic layers including a light emitting layer. With an electric field applied to the opposing electrodes, electrons and positive holes are injected from the cathode and the anode, respectively, into the light emitting layer, where they are recombined to form excitons, which emit light. Otherwise, energy is transferred from the excitons to create excitons of other molecules, which emit light. The light thus emitted from the light emitting layer is utilized to display an image.

For the purpose of improving driving durability of OELDs, it has been proposed to use a metal complex as a host material in the light emitting layer as disclosed, e.g., in JP-A-2002-305083. There still has been room for further improvement on efficiency and durability.

SUMMARY OF THE INVENTION

An object of the present invention is to provide an OELD exhibiting high luminance, high luminescence efficiency, and satisfactory durability.

The object of the invention is accomplished by an OELD comprising a pair of electrodes and at least one organic compound layer including a light emitting layer provided in between the electrodes, the light emitting layer containing at least one host material and at least one luminescent material, wherein the host material is a compound represented by formula (I):

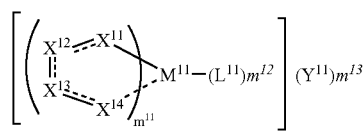

(I)

wherein $X^{11}$, $X^{12}$, $X^{13}$, and $X^{14}$ each represent a substituted or unsubstituted oxygen atom, a substituted or unsubstituted sulfur atom, a substituted or unsubstituted nitrogen atom, a substituted or unsubstituted carbon atom or a substituted or unsubstituted phosphorus atom; $M^{11}$ represents a metal ion; $L^{11}$ represents a ligand; $Y^{11}$ represents a counter ion; $m^{11}$ represents an integer of 1 to 4; $m^{12}$ represents an integer of 0 to 6; $m^{13}$ represents an integer of 0 to 4; and the $X^{11}$—$X^{12}$ bond, the $X^{12}$—$X^{13}$ bond, and the $X^{13}$—$X^{14}$ bond is a single bond or a double bond; with the proviso that a compound in which the ligand composed of $X^{11}$, $X^{12}$, $X^{13}$, and $X^{14}$ is one derived from an 8-hydroxyquinolinol derivative is excluded.

The object is also accomplished by preferred embodiments of the above-described OELD, in which:

(1) the luminescent compound is a phosphorescent compound that emits light via a triplet excited state;

(2) the compound represented by formula (I) is a compound represented by formula (IX):

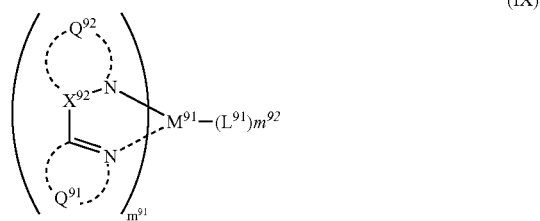

(IX)

wherein $M^{91}$ represents a metal ion; $L^{91}$ represents a ligand; $m^{91}$ represents an integer of 1 to 4; $m^{92}$ represents an integer of 0 to 6; $Q^{91}$ represents an atomic group necessary to form a nitrogen-containing heterocyclic ring; and $X^{92}$ and $Q^{92}$ each represent an atomic group necessary to form a nitrogen-containing heterocyclic ring;

(3) the host material and the phosphorescent compound have a $T_1$ value of 60 kcal/mol (251 kJ/mol) or higher, and the phosphorescent compound emits phosphorescence having a peak wavelength ($\lambda_{max}$) of 550 nm or shorter; or (4) the at least one organic compound layer is at least three organic compound layers including a hole transporting layer, a light emitting layer, and an electron transporting layer, and the electron transporting layer has an IP value of 5.9 eV or higher.

(5) the host material is a compound represented by formula (II):

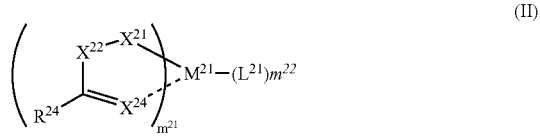

(II)

wherein $M^{21}$ represents a metal ion; $L^{21}$ represents a ligand; $m^{21}$ represents an integer of 1 to 4; $m^{22}$ represents an integer of 0 to 6; $X^{21}$ represents an oxygen atom or a substituted nitrogen atom; $X^{22}$ represents a substituted or unsubstituted carbon atom or a substituted nitrogen atom; $X^{24}$ represents a substituted nitrogen atom, a substituted phosphorus atom or an oxygen atom; and $R^{24}$ represents a substituted or unsubstituted carbon atom or a substituted nitrogen atom;

(6) the host material is a compound represented by formula (III):

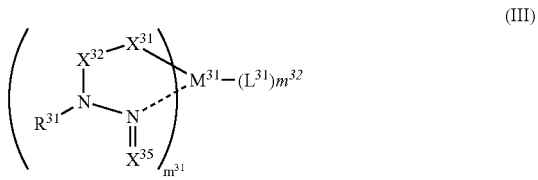

(III)

wherein $X^{31}$ represents an oxygen atom or a substituted nitrogen atom; $X^{32}$ represents a substituted or unsubstituted carbon atom or a substituted nitrogen atom; $M^{31}$ represents a metal ion; $L^{31}$ represents a ligand; $m^{31}$ represents an integer of 1 to 4; $m^{32}$ represents an integer of 0 to 6; $R^{31}$ represents a substituent; and $X^{35}$ represents a substituted carbon atom or a substituted nitrogen atom;

(7) the host material is a compound represented by formula (IV):

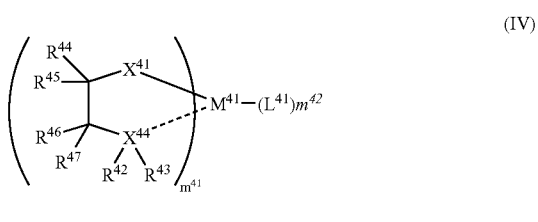

(IV)

wherein $M^{41}$ represents a metal ion; $L^{41}$ represents a ligand; $m^{41}$ represents an integer of 1 to 4; $m^{42}$ represents an integer of 0 to 6; $X^{41}$ represents an oxygen atom or a substituted nitrogen atom; $X^{44}$ represents a nitrogen atom or a phosphorus atom; $R^{44}$, $R^{45}$, $R^{46}$, and $R^{47}$ each represent a hydrogen atom or a substituent; and $R^{42}$ and $R^{43}$ each represent a substituent;

(8) the host material is a compound represented by formula (V):

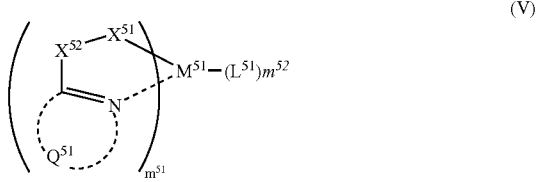

(V)

wherein $X^{51}$ represents an oxygen atom or a substituted nitrogen atom; $X^{52}$ represents a substituted or unsubstituted carbon atom or a substituted nitrogen atom; $M^{51}$ represents a metal ion; $L^{51}$ represents a ligand; $m^{51}$ represents an integer of 1 to 4; $m^{52}$ represents an integer of 0 to 6; and $Q^{51}$ represents a group necessary to form a nitrogen-containing heterocyclic ring;

(9) the host material is a compound represented by formula (VI):

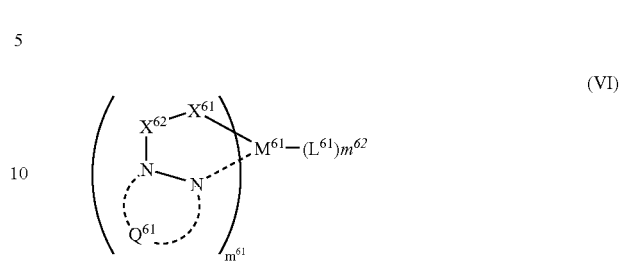

(VI)

wherein $X^{61}$ represents an oxygen atom or a substituted nitrogen atom; X62 represents a substituted or unsubstituted carbon atom or a substituted nitrogen atom; $M^{61}$ represents a metal ion; $L^{61}$ represents a ligand; $m^{61}$ represents an integer of 1 to 4; $m^{62}$ represents an integer of 0 to 6; and $Q^{61}$ represents a group necessary to form a nitrogen-containing heterocyclic ring;

(10) the host material is a compound represented by formula (VII):

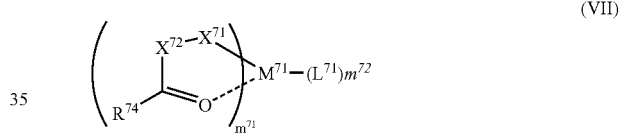

(VII)

wherein $X^{71}$ represents an oxygen atom or a substituted nitrogen atom; $X^{72}$ represents a substituted or unsubstituted carbon atom or a substituted nitrogen atom; $M^{71}$ represents a metal ion; $L^{71}$ represents a ligand; $R^{74}$ represents a substituted or unsubstituted carbon atom or a substituted nitrogen atom; $m^{71}$ represents an integer of 1 to 4; $m^{72}$ represents an integer of 0 to 6;

(11) the host material is a compound represented by formula (VIII):

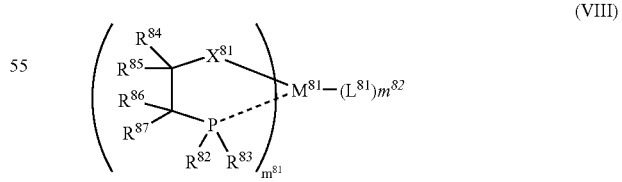

(VIII)

wherein $X^{81}$ represents an oxygen atom or a substituted nitrogen atom; $M^{81}$ represents a metal ion; $L^{81}$ represents a ligand; $R^{82}$, $R^{83}$, $R^{84}$, $R^{85}$, $R^{86}$ and $R^{87}$ each represent a hydrogen atom or a substituent; $m^{81}$ represents an integer of 1 to 4; and $m^{82}$ represents an integer of 0 to 6;

(12) the host material is a compound represented by formula (IX):

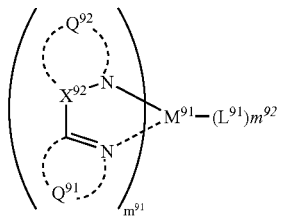

(IX)

wherein $M^{91}$ represents a metal ion; $L^{91}$ represents a ligand; $m^{91}$ represents an integer of 1 to 4; $m^{92}$ represents an integer of 0 to 6; $Q^{91}$ represents an atomic group necessary to form a nitrogen-containing heterocyclic ring; and $X^{92}$ and $Q^{92}$ each represent an atomic group necessary to form a nitrogen-containing heterocyclic ring.

(13) the host material is a compound represented by formula (X):

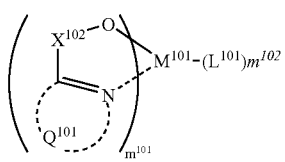

(X)

wherein $M^{101}$ represents a metal ion; $L^{101}$ represents a ligand; $Q^{101}$ represents a group necessary to form a nitrogen-containing heterocyclic ring; $m^{101}$ represents an integer of 1 to 4; $m^{102}$ represents an integer of 0 to 6; and $X^{102}$ represents a substituted or unsubstituted alkylene group, a carbonylene group or a sulfonylene group;

(14) the host material is a compound represented by formula (XI):

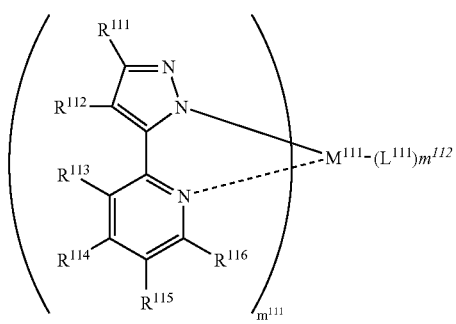

(XI)

wherein $M^{111}$ represents a metal ion; $L^{111}$ represents a ligand; $m^{111}$ represents an integer of 1 to 4; $m^{112}$ represents an integer of 0 to 6; and $R^{111}$, $R^{112}$, $R^{113}$, $R^{114}$, $R^{115}$, and $R^{116}$ each represent a hydrogen atom or a substituent;

(15) the at least one host material is at least two host materials;

(16) at least one of the host materials is an arylamine derivative;

(17) at least one of the host materials is an aromatic hydrocarbon compound;

(18) at least one of the host materials is an aromatic nitrogen-containing heterocyclic compound; or

(19) at least one of the host materials is a metal complex other than the compound represented by formula (I).

DETAILED DESCRIPTION OF THE INVENTION

The OELD of the present invention is a device having at least one organic compound layer (also called an organic layer) including a light emitting layer between a pair of electrodes, an anode and a cathode. The light emitting layer contains at least one host material and at least one luminescent compound. The OELD is characterized in that the host material is a compound represented by formula (I).

The terminology "host material" as used herein means a compound which primarily performs a function of injecting and/or transporting charges in the light emitting layer and which per se does not substantially emit light. The host material concentration in the light emitting layer is preferably 50 to 99.9% by weight, desirably 70 to 99.8% by weight, more desirably 80 to 99.7% by weight, most desirably 90 to 99.5% by weight.

In formula (I), $X^{11}$, $X^{12}$, $X^{13}$, and $X^{14}$ each represent an oxygen atom, a sulfur atom, a nitrogen atom, a carbon atom or a phosphorus atom, each of which may have a substituent. The substituents on $X^{11}$, $X^{12}$, $X^{13}$, and $X^{14}$ may be taken together to form a cyclic structure, such as a hydrocarbon ring (e.g., benzene, pyridine, pyrazole, imidazole or oxazole) or a heterocyclic ring.

Where $X^{11}$, $X^{12}$, $X^{13}$ or $X^{14}$ is a substituted carbon atom, the substituents of the carbon atom include an alkyl group (preferably having 1 to 30 carbon atoms, still preferably 1 to 20 carbon atoms, particularly preferably 1 to 10 carbon atoms, such as methyl, ethyl, isopropyl, t-butyl, n-octyl, n-decyl, n-hexadecyl, cyclopropyl, cyclopentyl or cyclohexyl), an alkenyl group (preferably having 2 to 30 carbon atoms, still preferably 2 to 20 carbon atoms, particularly preferably 2 to 10 carbon atoms, such as vinyl, allyl, 2-butenyl or 3-pentenyl), an alkynyl group (preferably having 2 to 30 carbon atoms, still preferably 2 to 20 carbon atoms, particularly preferably 2 to 10 carbon atoms, such as propargyl or 3-pentynyl), an aryl group (preferably having 6 to 30 carbon atoms, still preferably 6 to 20 carbon atoms, particularly preferably 6 to 12 carbon atoms, such as phenyl, p-methylphenyl, naphthyl or anthranyl), an amino group (preferably having up to 30 carbon atoms, still preferably up to 20 carbon atoms, particularly preferably up to 10 carbon atoms, such as amino, methylamino, dimethylamino, diethylamino, dibenzylamino, diphenylamino or ditolylamino), an alkoxy group (preferably having 1 to 30 carbon atoms, still preferably 1 to 20 carbon atoms, particularly preferably 1 to 10 carbon atoms, such as methoxy, ethoxy, butoxy or 2-ethylhexyloxy), an aryloxy group (preferably having 6 to 30 carbon atoms, still preferably 6 to 20 carbon atoms, particularly preferably 6 to 12 carbon atoms, such as phenyloxy, 1-naphthyloxy or 2-naphthyloxy), a heterocyclic oxy group (preferably having 1 to 30 carbon atoms, still preferably 1 to 20 carbon atoms, particularly preferably 1 to 12 carbon atoms, such as pyridyloxy, pyrazyloxy, pyrimidyloxy or quinolyloxy), an acyl group (preferably having 1 to 30 carbon atoms, still preferably 1 to 20 carbon atoms, particularly preferably 1 to 12 carbon atoms, such as acetyl, benzoyl, formyl or pivaloyl), an alkoxycarbonyl group (preferably having 2 to 30 carbon atoms, still preferably 2 to 20 carbon atoms, particularly preferably 2 to 12 carbon atoms, such as methoxycarbonyl or ethoxycarbonyl), an aryloxycarbonyl group (preferably having 7 to 30 carbon atoms, still preferably 7 to 20 carbon atoms, particularly preferably 7 to 12 carbon atoms, such as phenyloxycarbonyl), an acyloxy group (preferably having 2 to 30 carbon atoms, still preferably 2 to 20 carbon atoms, particularly preferably 2 to 10 carbon atoms, such as acetoxy or benzoyloxy), an acylamino group (preferably having 2 to 30 carbon atoms, still preferably 2 to 20 carbon atoms, particularly preferably 2 to 10 carbon atoms, such as acetylamino or benzoylamino), an alkoxycarbonylamino group (preferably having 2 to 30 carbon atoms, still preferably 2 to 20 carbon atoms, particularly preferably 2 to 12 carbon atoms, such as methoxycarbonylamino), an aryloxycarbonylamino group (preferably having 7 to 30 carbon atoms, still preferably 7 to 20 carbon atoms, particularly preferably 7 to 12 carbon atoms, such as phenyloxycarbonylamino), a sulfonylamino group (preferably having 1 to 30 carbon atoms, still preferably 1 to 20 carbon atoms, particularly preferably 1 to 12 carbon atoms, such as methanesulfonylamino or benzenesulfonylamino), a sulfamoyl group (preferably having up to 30 carbon atoms, still preferably up to 20 carbon atoms, particularly preferably up to 12 carbon atoms, such as sulfamoyl, methylsulfamoyl, dimethylsulfamoyl or phenylsulfamoyl), a carbamoyl group (preferably having 1 to 30 carbon atoms, still preferably 1 to 20 carbon atoms, particularly preferably 1 to 12 carbon atoms, such as carbamoyl, methylcarbamoyl, diethylcarbamoyl or phenylcarbamoyl), an alkylthio group (preferably having 1 to 30 carbon atoms, still preferably 1 to 20 carbon atoms, particularly preferably 1 to 12 carbon atoms, such as methylthio or ethylthio), an arylthio group (preferably having 6 to 30 carbon atoms, still preferably 6 to 20 carbon atoms, particularly preferably 6 to 12 carbon atoms, such as phenylthio), a heterocyclic thio group (preferably having 1 to 30 carbon atoms, still preferably 1 to 20 carbon atoms, particularly preferably 1 to 12 carbon atoms, such as pyridylthio, 2-benzimidazolylthio, 2-benzoxazolylthio or 2-benzothiazolylthio), a sulfonyl group (preferably having 1 to 30 carbon atoms, still preferably 1 to 20 carbon atoms, particularly preferably 1 to 12 carbon atoms, such as mesyl or tosyl), a sulfinyl group (preferably 1 having 1 to 30 carbon atoms, still preferably 1 to 20 carbon atoms, particularly preferably 1 to 12 carbon atoms, such as methanesulfinyl or benzenesulfinyl), a ureido group (preferably having 1 to 30 carbon atoms, still preferably 1 to 20 carbon atoms, particularly preferably 1 to 12 carbon atoms, such as ureido, methylureido or phenylureido), a phosphoric acid amide group (preferably having 1 to 30 carbon atoms, still preferably 1 to 20 carbon atoms, particularly preferably 1 to 12 carbon atoms, such as diethylphosphoramide or phenylphosphoramide), a hydroxyl group, a mercapto group, a halogen atom (e.g., fluorine, chlorine, bromine or iodine), a cyano group, a sulfo group, a carboxyl group, a nitro group, a hydroxamic acid group, a sulfino group, a hydrazino group, an imino group, a heterocyclic group (containing a nitrogen atom, an oxygen atom, a sulfur atom, etc. as a hetero atom and preferably having 1 to 30 carbon atoms, still preferably 1 to 12 carbon atoms, such as imidazolyl, pyridyl, quinolyl, furyl, thienyl, piperidyl, morpholino, benzoxazolyl, benzimidazolyl, benzothiazolyl, carbazolyl or azepinyl), a silyl group (preferably having 3 to 30 carbon atoms, still preferably 3 to 30 carbon atoms, particularly preferably 3 to 24 carbon atoms, such as trimethylsilyl or triphenylsilyl), a silyloxy group (preferably having 3 to 40 carbon atoms, still preferably 3 to 30 carbon atoms, particularly preferably 3 to 24 carbon atoms, such as trimethylsilyloxy or triphenylsilyloxy), a group forming a carbonyl group, a group forming an alkenyl group, and a group forming an imino group. These substituents that may be on the carbon atom will hereinafter be referred to as "substituents A". The substituents A may each have a substituent.

Where $X^{11}$, $X^{12}$, $X^{13}$ or $X^{14}$ is a substituted nitrogen atom, the substituents of the nitrogen atom include an alkyl group, an alkenyl group, an aryl group, a heteroaryl group, an acyl group (e.g., acetyl, benzoyl or trifluoroacetyl), a sulfonyl group (e.g., methanesulfonyl or pentafluorobenzenesulfonyl), a hydroxyl group, an alkoxy group, an amino group, an imino group, and a group forming an imino group. These substituents may have a substituent selected from, for example, substituents A.

Where $X^{11}$, $X^{12}$, $X^{13}$ or $X^{14}$ is a substituted phosphorus atom, the substituents of the phosphorus atom include an alkyl group, an alkenyl group, an aryl group, a heteroaryl group, an acyl group, a sulfonyl group, a hydroxyl group, an alkoxy group, an amino group, and an imino group. These substituents may have a substituent selected from, for example, substituents A.

Where $X^{14}$ is a substituted oxygen atom or a substituted sulfur atom, and $X^{13}$—$X^{14}$ bond is a single bond, the substituents of the oxygen atom or the sulfur atom include an alkyl group, an alkenyl group, an aryl group, a heteroaryl group, an acyl group, and a sulfonyl group. These substituents may have a substituent selected from, for example, substituents A.

$X^{11}$ is preferably an oxygen atom or a substituted nitrogen atom, still preferably an oxygen atom or a substituted nitrogen atom that is connected to $X^{12}$ to form a nitrogen-containing heterocyclic ring, particularly preferably a substituted nitrogen atom that is connected to $X^{12}$ to form a nitrogen-containing heterocyclic ring.

$X^{12}$ is preferably a substituted or unsubstituted carbon atom or a substituted nitrogen atom, still preferably a substituted or unsubstituted carbon atom, particularly preferably a carbonylene group, an alkylene group or a group that is connected to $X^{11}$ to form a cyclic structure.

$X^{13}$ is preferably a substituted carbon atom, a substituted nitrogen atom or a group that is connected to $X^{14}$ to form a cyclic structure, still preferably a group that is connected to $X^{14}$ to form a heterocyclic ring, particularly preferably a group that is connected to $X^{14}$ to form an aromatic nitrogen-containing heterocyclic ring.

$X^{14}$ is preferably a substituted nitrogen atom, a substituted phosphorus atom, an oxygen atom or a sulfur atom, still preferably a substituted nitrogen atom, a substituted phosphorus atom or an oxygen atom, particularly preferably a substituted nitrogen atom, especially preferably a substituted nitrogen atom that is connected to $X^{13}$ to form a nitrogen-containing heterocyclic ring.

The $X^{11}$—$X^{12}$ bond, the $X^{12}$—$X^{13}$ bond, and the $X^{13}$—$X^{14}$ bond are each a single bond or a double bond. Whether the bond is single or double is not matter of choice but is governed by whether the compound can exist or not. For instance, when $X^{11}$ is an oxygen atom, a sulfur atom or a substituted nitrogen atom, the $X^{11}$—$X^{12}$ bond should be single.

The $X^{11}$—$X^{12}$ bond and the $X^{12}$—$X^{13}$ bond are each preferably a single bond, and the $X^{13}$—$X^{14}$ bond is preferably a double bond.

The metal species of the metal ion represented by $M^{11}$ includes, but is not limited to, alkali metals, alkaline earth metals, lanthanides (rare earth metals), transition metals, and typical metals. Preferred examples of $M^{11}$ are ions of berylium, magnesium, aluminum, zinc, gallium or barium. A berylium ion, a magnesium ion, an aluminum ion or a zinc ion is still preferred. An aluminum ion or a zinc ion is particularly preferred. A zinc ion is the most preferred.

The ligand represented by $L^{11}$ includes those described, e.g., in H. Yersin, *Photochemistry and Photophysics of Coordination Compounds*, Springer-Verlag, 1987 and Yamamoto Akio, *Yukikinzokukagaku-kiso to ohyo*, Shokabo Publishing Co., 1982. Preferred ligands include halogen ligands (e.g., Cl⁻ and F⁻), nitrogen-containing heterocyclic ligands (e.g., bipyridyl, phenanthroline, phenylpyridine, pyrazolylpyridine, and benzimidazolylpyridine), diketone ligands, nitrile ligands, CO ligands, isonitrile ligands, phosphorus ligands (e.g., phosphine derivatives, phosphorous ester derivatives, and phosphinine derivatives), carboxylic acid ligands (e.g., acetic acid ligand), aryloxy ligands (e.g., phenoxy, biphenyloxy, and cyanophenoxy), and siloxy ligands (e.g., triphenylsiloxy). Still preferred are bidentate nitrogen-containing heterocyclic ligands (e.g., bipyridyl, phenanthroline, phenylpyridine, pyrazolylpyridine, benzimidazolylpyridine, and picolinic acid), diketone ligands (e.g., acetylacetone), aryloxy ligands, and siloxy ligands. Nitrogen-containing heterocyclic ligands are particularly preferred.

The counter ion represented by $Y^{11}$ preferably includes, but is not limited to, alkali metal ions, alkaline earth metal ions, halide ions, a perchlorate ion, a $PF_6$ ion, ammonium ions (e.g., tetramethylammonium ion), a borate ion, and a phosphonium ion. A perchlorate ion and a $PF_6$ ion are still preferred.

$m^{11}$ is an integer of 1 to 4, preferably 1 to 3. $m^{12}$ is an integer of 0 to 6, preferably 0 to 2, still preferably 0 or 1, particularly preferably 0. $m^{13}$ is an integer of 0 to 4, preferably 0 to 2, still preferably 0 or 1, particularly preferably 0.

From the ligands composed of $X^{11}$, $X^{12}$, $X^{13}$, and $X^{14}$ are excluded those derived from 8-hydroxyquinolinol and derivatives thereof (e.g., 8-hydroxy-2-methylquinoline). It is preferred that $X^{11}$, $X^{12}$, $X^{13}$, and $X^{14}$ form ligands except those containing a quinoline ring.

The compound represented by formula (I) may have an additional metal ion on the ligand to form a polynuclear complex.

Of the compounds of formula (I) preferred are those represented by formulae (II), (III), and (IV) shown below, still preferred are those of formulae (V), (VI), (VII), and (VIII) shown below, particularly preferred are those of formulae (IX) and (X) shown below. The most preferred are those of formula (XI) shown below.

The compounds of formulae (II) and (III) are preferred to the compounds of formula (IV). The compounds of formula (II) are preferred to the compounds of formula (III).

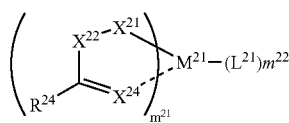

(II)

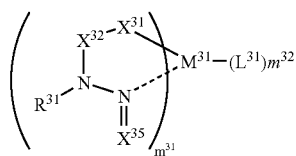

(III)

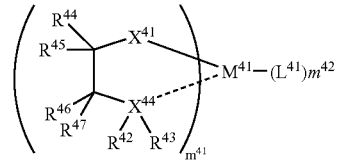

(IV)

In formula (II), $M^{21}$, $L^{21}$, $m^{21}$, and $m^{22}$ have the same meanings as $M^{11}$, $L^{11}$, $m^{11}$, and $m^{12}$, respectively (the preferred ranges for the former are the same as for the latter); $X^{21}$ represents an oxygen atom or a substituted nitrogen atom; $X^{22}$ represents a substituted or unsubstituted carbon atom or a substituted nitrogen atom; $X^{24}$ represents a substituted nitrogen atom, a substituted phosphorus atom or an oxygen atom; and $R^{24}$ represents a substituted or unsubstituted carbon atom or a substituted nitrogen atom.

$X^{21}$ is preferably an oxygen atom, a nitrogen atom substituted with an electron attracting group (e.g., acyl or sulfonyl) or a substituted nitrogen atom that is connected to $X^{22}$ to form a nitrogen-containing heterocyclic ring, still preferably a substituted nitrogen atom that is connected to $X^{22}$ to form a nitrogen-containing heterocyclic ring, particularly an azole ring (e.g., pyrazole, imidazole or benzimidazole). A substituted nitrogen atom that is connected to $X^{22}$ to form a monocyclic azole ring is particularly preferred.

$X^{22}$ is preferably a substituted or unsubstituted carbon atom, still preferably a carbonylene group, an alkylene group or a group connected to $X^{21}$ to form a nitrogen-containing heterocyclic ring, particularly preferably a carbonylene group or a group connected to $X^{21}$ to form an azole ring. A group connected to $X^{21}$ to form a monocyclic azole ring is especially preferred.

$X^{24}$ is preferably a substituted nitrogen atom or an oxygen atom, still preferably a substituted nitrogen atom, particularly preferably a substituted nitrogen atom that is connected to $R^{24}$ to form an aromatic nitrogen-containing heterocyclic ring (5- or 6-membered aromatic nitrogen-containing heterocyclic ring such as pyridine and benzoazole is preferable), especially a 6-membered aromatic nitrogen-containing heterocyclic ring (e.g., pyridine).

$R^{24}$ is preferably a substituted carbon atom, still preferably a substituted carbon atom that is connected to $X^{24}$ to form a cyclic structure, particularly an aromatic nitrogen-containing heterocyclic ring. A substituted carbon atom that is connected to $X^{24}$ to form a 6-membered aromatic nitrogen-containing heterocyclic ring is especially preferred.

In formula (III), $X^{31}$, $X^{32}$, $M^{31}$, $L^{31}$, $m^{31}$, and $m^{32}$ have the same meanings as $X^{21}$, $X^{22}$, $M^{21}$, $L^{21}$, $m^{21}$, and $m^{22}$, respectively (the preferred ranges for the former are the same as for the latter); $R^{31}$ represents a substituent; and $X^{35}$ represents a substituted carbon atom or a substituted nitrogen atom.

The substituent represented by $R^{31}$ includes those recited above as a substituent of the substituted nitrogen atom represented by $X^{13}$. $R^{31}$ is preferably a group that is connected to $X^{35}$ to form a nitrogen-containing heterocyclic ring, particularly an aromatic nitrogen-containing heterocyclic ring, especially an pyrazole ring.

$X^{35}$ is preferably a group that is connected to $R^{31}$ to form a nitrogen-containing heterocyclic ring, particularly an aromatic nitrogen-containing heterocyclic ring, especially an pyrazole ring.

In formula (IV), $M^{41}$, $L^{41}$, $m^{41}$, and $m^{42}$ have the same meanings as $M^{21}$, $L^{21}$, $m^{21}$, and $m^{22}$, respectively (the preferred ranges for the former are the same as for the latter); $X^{41}$ represents an oxygen atom or a substituted nitrogen atom; $X^{44}$ represents a nitrogen atom or a phosphorus atom; $R^{44}$, $R^{45}$, $R^{46}$, and $R^{47}$ each represent a hydrogen atom or a substituent; $R^{44}$ and $R^{46}$ may be taken together to form a carbon-carbon double bond; $R^{45}$ and $R^{47}$ may be taken together to form a cyclic structure (e.g., benzene ring); and $R^{42}$ and $R^{43}$ each represent a substituent.

$X^{41}$ is preferably an oxygen atom or a nitrogen atom substituted with an electron attracting group, still preferably a nitrogen atom substituted with an electron attracting group, particularly preferably a nitrogen atom substituted with an acyl group (e.g., acetyl, trifluoroacetyl or perfluorobenzoyl) or a sulfonyl group (e.g., methanesulfonyl, trifluoromethanesulfonyl or benzenesulfonyl).

$X^{44}$ is preferably a phosphorus atom.

$R^{44}$, $R^{45}$, $R^{46}$, and $R^{47}$ are each preferably a hydrogen atom, an alkyl group, an aryl group, a heterocyclic group, a group capable of forming a carbon-carbon double bond or a group capable of forming a cyclic structure, still preferably a hydrogen atom, an alkyl group or a group capable of forming a cyclic structure, particularly preferably a group capable of forming a cyclic structure, especially a benzene ring.

$R^{42}$ and $R^{43}$ are each preferably an alkyl group, an aryl group or a heterocyclic group, still preferably an alkyl group or an aryl group, particularly preferably an aryl group.

Of the compounds represented by formula (I), preferred are those represented by formulae (V) to (VIII) shown below. The compounds of formulae (V), (VI), and (VII) are preferred to those of formula (VIII). The compounds of formulae (V) and (VI) are preferred to those of formula (VII). The compounds of formula (V) are preferred to those of formula (VI).

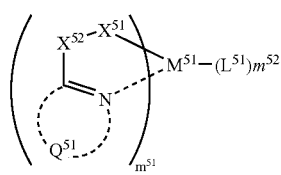
(V)

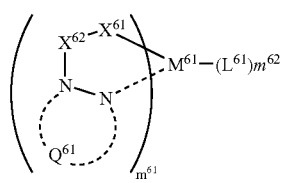
(VI)

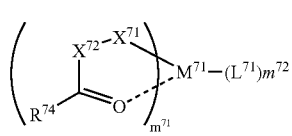
(VII)

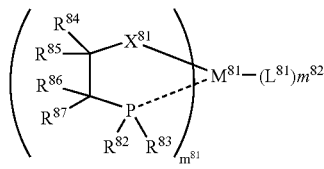
(VIII)

In formula (V), $X^{51}$, $X^{52}$, $M^{51}$, $L^{51}$, $m^{51}$, and $m^{52}$ have the same meanings as $X^{21}$, $X^{22}$, $M^{21}$, $L^{21}$, $m^{21}$, and $m^{22}$, respectively (the preferred ranges for the former are the same as for the latter); and $Q^{51}$ represents a group necessary to form a nitrogen-containing heterocyclic ring (preferably a monocyclic nitrogen-containing heterocyclic ring or a 5- or 6-membered condensed nitrogen-containing heterocyclic ring).

The nitrogen-containing heterocyclic ring completed by $Q^{51}$ is preferably an aromatic one. The aromatic nitrogen-containing ring preferably includes a pyrrole ring, a pyrazole ring, an imidazole ring, a triazole ring, an oxazole ring, a thiazole ring, an oxadiazole ring, a thiadiazole ring, a pyridine ring, a pyrazine ring, a pyrimidine ring, and a condensed ring thereof (e.g., benzoxazole or imidazopyridine), still preferably a pyrrole ring, a pyrazole ring, an imidazole ring, a triazole ring, an oxazole ring, a thiazole ring, an oxadiazole ring, a thiadiazole ring, a pyridine ring, a pyrazine ring, a pyrimidine ring, and a 5- or 6-membered condensed ring thereof (e.g., benzoimidazole or imidazopyridine), particularly preferably a pyrazole ring, an imidazole ring, a pyridine ring, and a 5- or 6-membered condensed ring thereof. A pyridine ring and a 5- or 6-membered condensed ring thereof are the most preferred.

In formula (VI), $X^{61}$, $X^{62}$, $M^{61}$, $L^{61}$, $m^{61}$, and $m^{62}$ have the same meanings as $X^{21}$, $X^{22}$, $M^{21}$, $L^{21}$, $m^{21}$, and $m^{22}$, respectively (the preferred ranges for the former are the same as for the latter); and $Q^{61}$ represents a group necessary to form a nitrogen-containing heterocyclic ring (preferably a monocyclic nitrogen-containing heterocyclic ring).

The nitrogen-containing heterocyclic ring completed by $Q^{61}$ is preferably an aromatic one. The aromatic nitrogen-containing ring preferably includes a pyrazole ring, a triazole ring, an oxadiazole ring, a thiadiazole ring, and a condensed ring thereof, still preferably a pyrazole ring and a triazole ring, particularly preferably a pyrazole ring.

In formula (VII), $X^{71}$, $X^{72}$, $M^{71}$, $L^{71}$, $R^{74}$, $m^{71}$, and $m^{72}$ have the same meanings as $X^{21}$, $X^{22}$, $M^{21}$, $L^{21}$, $R^{24}$, $m^{21}$ and $m^{22}$, respectively (the preferred ranges for the former are the same as for the latter).

In formula (VIII), $X^{81}$, $M^{81}$, $L^{81}$, $R^{82}$, $R^{83}$, $R^{84}$, $R^{85}$, $R^{86}$, $R^{87}$, $m^{81}$, and $m^{82}$ have the same meanings as $X^{21}$, $M^{21}$, $L^{21}$, $R^{42}$, $R^{43}$, $R^{44}$, $R^{45}$, $R^{46}$, $R^{47}$, $m^{21}$, and $m^{22}$, respectively (the preferred ranges for the former are the same as for the latter).

The compounds of formula (I) preferably include those represented by formula (IX) and (X) shown below. The compounds of formula (IX) are preferred to those of formula (X).

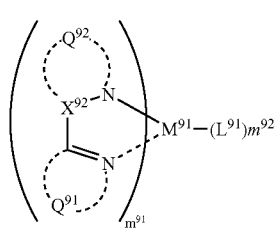
(IX)

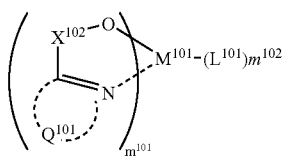

In formula (IX), $M^{91}$, $L^{91}$, $Q^{91}$, $m^{91}$, and $m^{92}$ have the same meanings as $M^{21}$, $L^{21}$, $Q^{51}$, $m^{21}$, and $m^{22}$, respectively (the preferred ranges for the former are the same as for the latter); and $X^{92}$ and $Q^{92}$ each represent an atomic group necessary to form a nitrogen-containing heterocyclic ring (preferably a monocyclic nitrogen-containing ring).

The nitrogen-containing heterocyclic ring completed by $X^{92}$ and $Q^{92}$ is preferably an aromatic one, still preferably a pyrrole ring, a pyrazole ring, an imidazole ring, a triazole ring, or a condensed ring thereof, particularly preferably a monocyclic pyrrole ring, a monocyclic pyrazole ring or a monocyclic imidazole ring. A monocyclic pyrazole ring is the most preferred.

In formula (X), $M^{101}$, $L^{101}$, $Q^{101}$, $m^{101}$, and $m^{102}$ have the same meanings as $M^{21}$, $L^{21}$, $Q^{51}$, $m^{21}$, and $m^{22}$, respectively (the preferred ranges for the former are the same as for the latter); and $X^{102}$ represents a substituted or unsubstituted alkylene group, a carbonylene group or a sulfonylene group.

The substituent of the substituted alkylene group preferably includes an alkyl group and an aryl group. $X^{102}$ is preferably an alkylene group or a carbonylene group, still preferably a carbonylene group.

The compounds of formula (I) preferably include those represented by formula (XI):

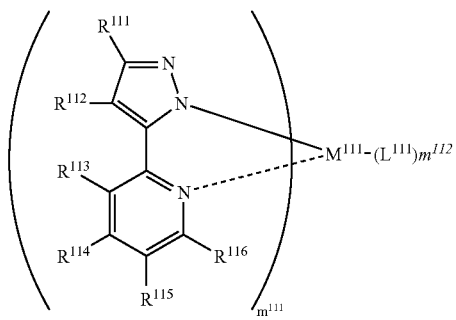

wherein $M^{111}$, $L^{111}$, $m^{111}$, and $m^{112}$ have the same meanings as $M^{21}$, $L^{21}$, $m^{21}$, and $m^{22}$, respectively (the preferred ranges for the former are the same as for the latter); and $R^{111}$, $R^{112}$, $R^{113}$, $R^{114}$, $R^{115}$, and $R^{116}$ each represent a hydrogen atom or a substituent.

$R^{111}$ and $R^{112}$ are each preferably a hydrogen atom, an alkyl group, an aryl group, a heterocyclic group, a cyano group, an alkoxy group or a fluorine atom, with a hydrogen atom or an alkyl group being still preferred.

The host material of the present invention preferably has a glass transition temperature of 100° to 500° C., still preferably 110° to 300° C., particularly preferably 120° to 250° C.

The light emitting layer contains at least one host material and at least one luminescent compound, and the at least one host material is the compound of formula (I). The luminescent compound used in the present invention is a compound performing a light emitting function in the light emitting layer. The luminescence may be either fluorescence or phosphorescence or both. The luminescent compound is preferably a phosphorescent compound which emits light from a triplet excited state. The luminescent material in the light emitting layer preferably consists of one or more phosphorescent compounds.

Other host materials that can be used in combination with the compound of formula (I) include arylamine derivatives (e.g., triphenylamine derivatives and benzidine derivatives), aromatic hydrocarbon compounds (e.g., triphenylbenzene derivatives, triphenylene derivatives, phenanthrene derivatives, naphthalene derivatives, and tetraphenylene derivatives), aromatic nitrogen-containing heterocyclic compounds (e.g., pyridine derivatives, pyrazine derivatives, pyrimidine derivatives, triazine derivatives, pyrazole derivatives, imidazole derivatives, oxazole derivatives, and pyrrole derivatives), and metal complexes (e.g., zinc complexes, aluminum complexes, and gallium complexes).

The luminescent compound concentration in the light emitting layer is preferably 0.1 to 50% by weight, desirably 0.2 to 30% by weight, more desirably 0.3 to 20% by weight, most desirably 0.5 to 10% by weight.

The phosphorescent compound preferably includes, but is not limited to, transition metal complexes capable of emitting phosphorescence from the triplet excited state. The center metal of the transition metal complexes preferably includes iridium, platinum, rhenium, ruthenium, palladium, rhodium, and rare earth metals. Iridium and platinum are still preferred. The ortho-carbometalated iridium complexes having a difluorophenylpyridine ligand which are disclosed in JP-A-2002-235076, JP-A-2002-170684, and Japanese Patent Application Nos. 2001-239281 and 2001-248165 and compounds represented by formula (XII) shown below are preferred.

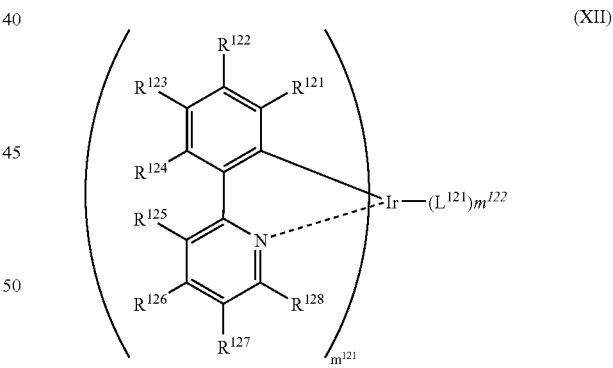

wherein $R^{121}$, $R^{122}$, $R^{123}$, $R^{124}$, $R^{125}$, $R^{126}$, $R^{127}$, and $R^{127}$ each represent a hydrogen atom or a substituent; $L^{121}$ represents a ligand; $m^{121}$ represents an integer of 1 to 3; and $m^{122}$ represents an integer of 0 to 4.

$R^{121}$ is preferably a hydrogen atom or an alkyl group, still preferably a hydrogen atom. $R^{122}$ is preferably a hydrogen atom, an alkyl group or a fluorine atom, still preferably a fluorine atom. $R^{123}$ is preferably a hydrogen atom, an alkyl group or a fluorine atom, still preferably a hydrogen atom or a fluorine atom. $R^{124}$ is preferably a hydrogen atom, an alkyl group or a fluorine atom, still preferably a hydrogen atom or a fluorine atom, particularly preferably a fluorine atom.

$R^{125}$, $R^{127}$, and $R^{128}$ are each preferably a hydrogen atom or an alkyl group, still preferably a hydrogen atom. $R^{126}$ is preferably a hydrogen atom, an alkyl group, an alkoxy group or a substituted amino group (preferably dialkylamino or diarylamino, still preferably dialkylamino).

The ligand as $L^{121}$ preferably includes a phosphorus ligand, a carbon monoxide ligand, a halogen ligand, a diketone ligand, and a bidentate nitrogen-containing heterocyclic ligand (e.g., phenylbenzoxazole, pyrazolylpyridine, triazolylpyridine, picolinic acid or a condensed ring thereof). A bidentate nitrogen-containing heterocyclic ligand is still preferred. A pyrazolylpyridine ligand, a triazolylpyridine ligand or a picolinic acid ligand is particularly preferred. A pyrazolylpyridine ligand or a triazolylpyridine ligand is especially preferred.

$m^{121}$ is preferably 2 or 3, still preferably 2. Where $m^{121}$ is 2 or 3, the phenylpyridine ligands maybe the same or different.

$m^{122}$ is preferably 0 to 2, still preferably 0 or 1, particularly preferably 1.

The phosphorescent compounds described in the following literature are also preferably used in the invention: U.S. Pat. Nos. 6,303,238B1 and 6,097,147, WO 00/57676, WO 00/70655, WO 01/08230, WO 01/39234A2, WO 01/41512A1, WO 02/02714A2, WO 02/15645A1, JP-A-2001-247859, Japanese Patent Application No. 2000-33561, JP-A-2002-117978, Japanese Patent Application No. 2001-248165, JP-A-2002-235076, Japanese Patent Application No. 2001-239281, JP-A-2002-170684, EP 1211257, JP-A-2002-226495, JP-A-2002-234894, JP-A-2001-247859, JP-A-2001-298470, JP-A-2002-173674, JP-A-2002-203678, and JP-A-2002-203679.

The phosphorescence life time of the phosphorescent compound to be used is not particularly limited but is preferably 1 ms or shorter, still preferably 100 μs or shorter, particularly preferably 10 μs or shorter, at room temperature.

It is preferred that the host material and the phosphorescent compound have a $T_1$ value of 60 kcal/mol (251 kJ/mol) or higher and that the phosphorescent compound emits phosphorescence having a peak wavelength ($\lambda_{max}$) of 550 nm or shorter. It is still preferred that the host material and the phosphorescent compound have a $T_1$ value of 62 kcal/mol (259 kJ/mol) or higher and that the phosphorescent compound emits phosphorescence having a peak wavelength ($\lambda_{max}$) of 500 nm or shorter. It is particularly preferred that the host material and the phosphorescent compound have a $T_1$ value of 65 kcal/mol (272 kJ/mol) or higher and that the phosphorescent compound emits phosphorescence having a peak wavelength ($\lambda_{max}$) of 480 nm or shorter. It is the most preferred that the host material and the phosphorescent compound have a $T_1$ value of 65 kcal/mol (272 kJ/mol) or higher and that the phosphorescent compound emits phosphorescence having a peak wavelength ($\lambda_{max}$) of 470 nm or shorter.

It is preferred that the at least one organic compound layer be at least three organic compound layers including a hole transporting layer, a light emitting layer, and an electron transporting layer and that the electron transporting layer have an IP value of 5.9 eV or higher, particularly 6.0 eV or higher, especially 6.1 eV or higher.

The host material and the luminescent compound may be either low molecular compounds or oligomeric or polymeric compounds. The oligomeric or polymeric compounds preferably have a polystyrene equivalent weight average molecular weight of 1,000 to 5,000,000, particularly 2,000 to 1,000,000, especially 3,000 to 100,000. The polymeric materials, which may be either homopolymers or copolymers, include polymers containing the structure represented by formulae (I) through (XII) in the main chain or the side chain thereof. The host material and the luminescent compound are preferably low molecular compounds.

Specific but non-limiting examples of the compounds represented by formula (I) are shown below. In addition to the examples shown, polynuclear complexes composed of the ligands and metal ions used in the compounds shown (e.g., complexes having two zinc atoms to which three pyrazolylpyridine ligands are coordinated) are also suitable.

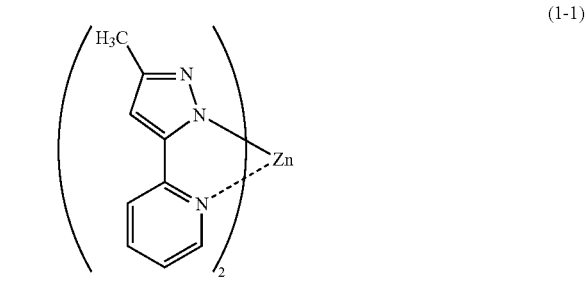

(1-1)

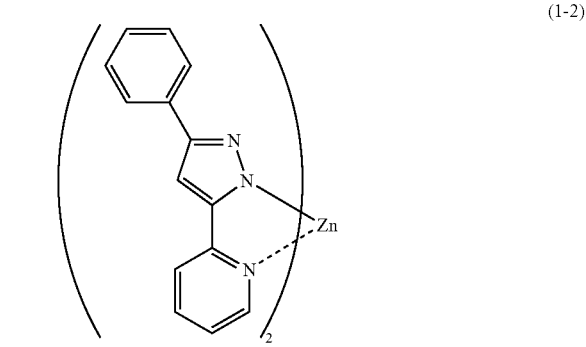

(1-2)

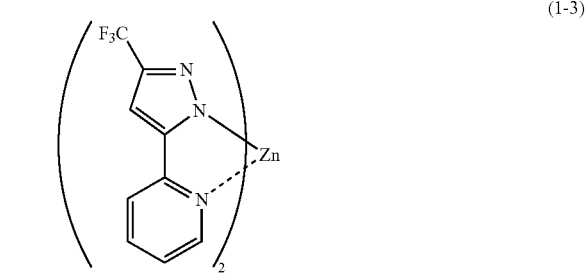

(1-3)

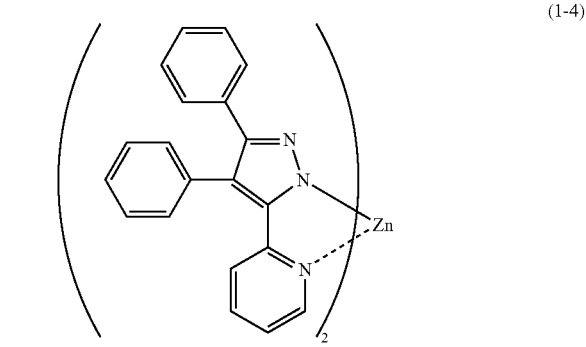

(1-4)

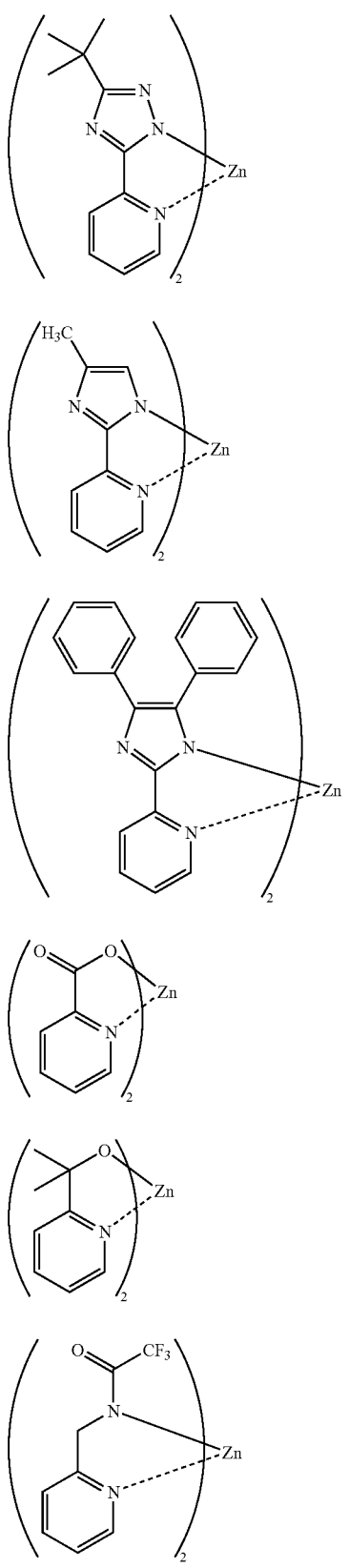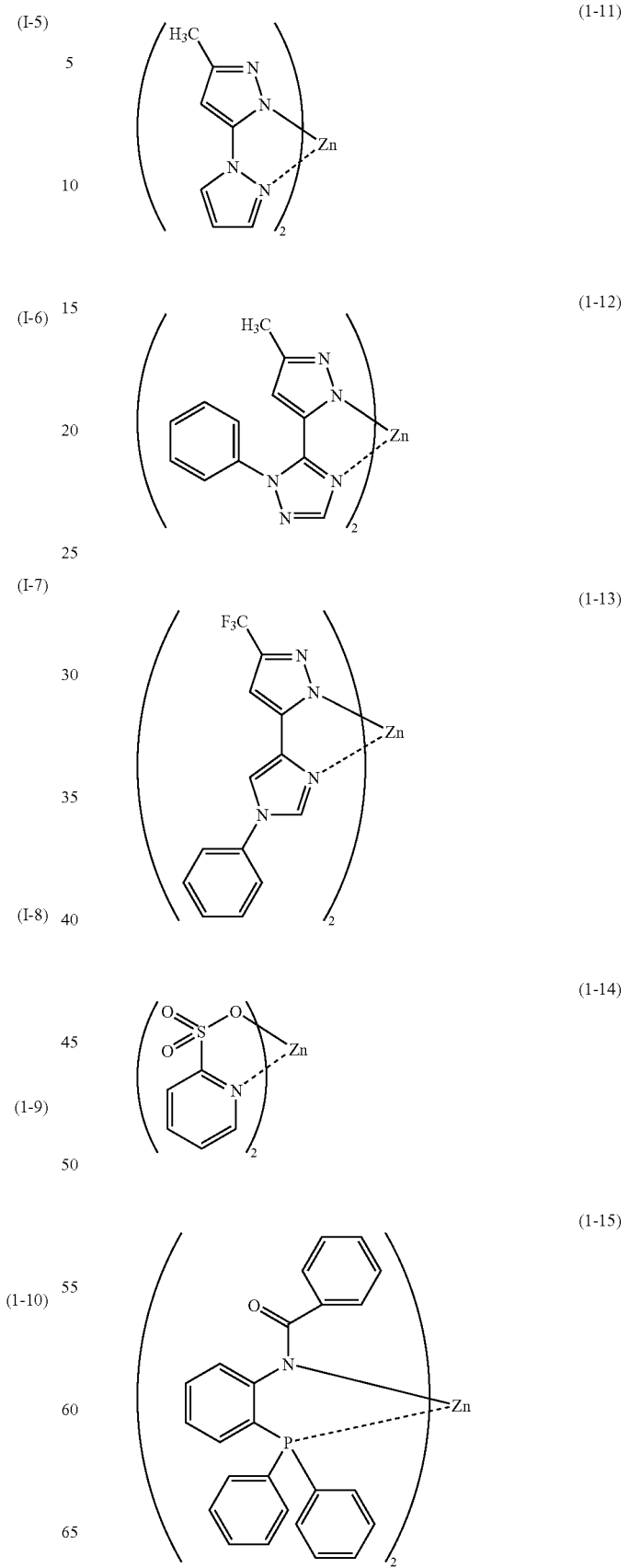

(1-16) 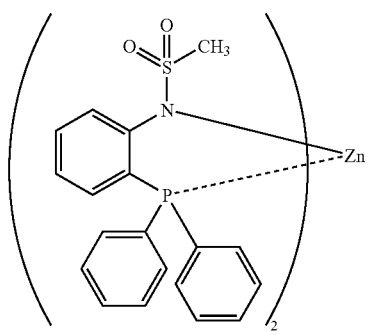
(1-17) 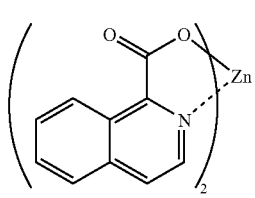
(1-18) 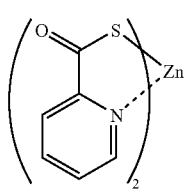
(1-19) 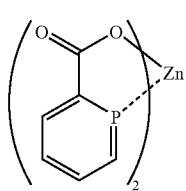
(1-20) 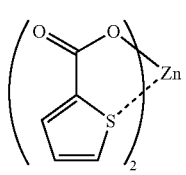
(1-21) 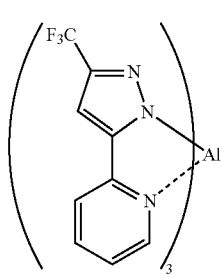
(1-22) 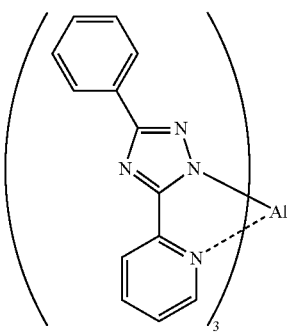
(1-23) 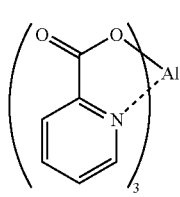
(1-24) 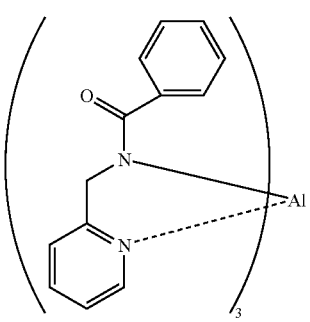
(1-25) 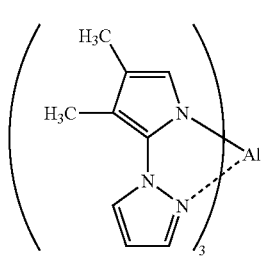
(1-26) 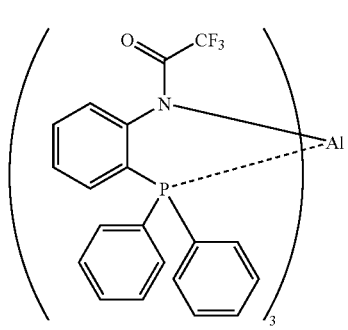

-continued
(1-27)
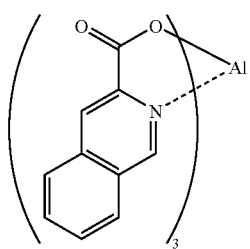
(1-28)
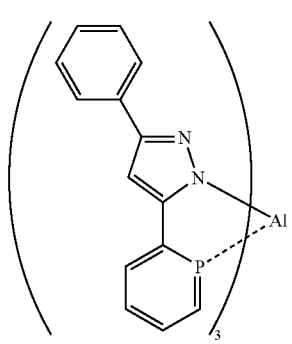
(1-29)
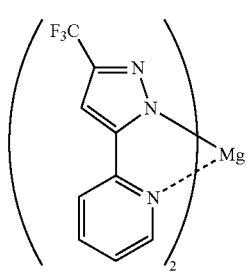
(1-30)
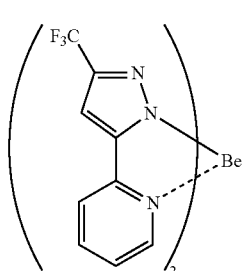
(1-31)
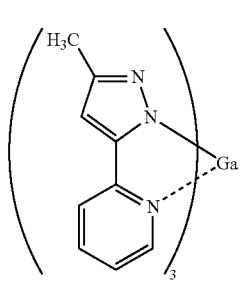
-continued
(1-32)
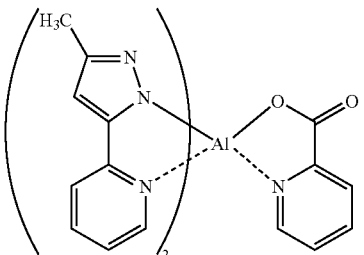
(1-33)
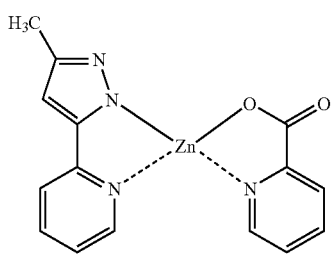
(1-34)
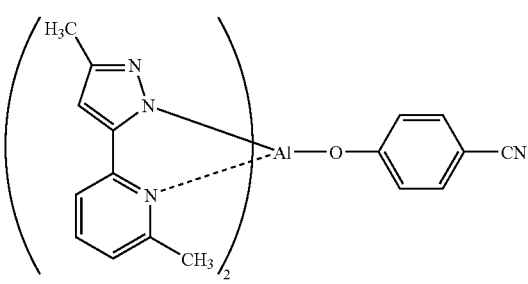
(1-35)
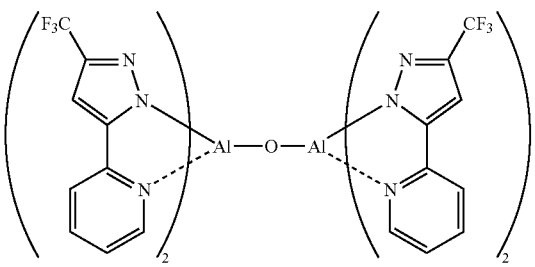
(1-36)
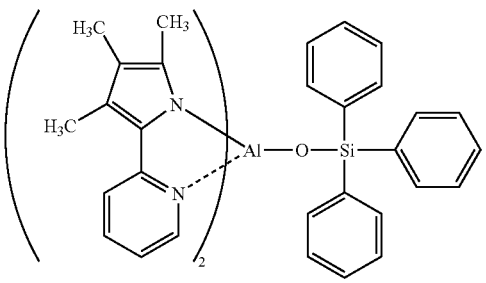

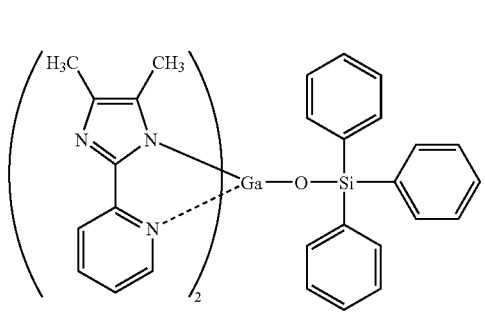 (1-37)
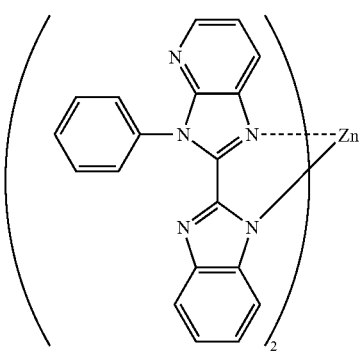 (1-59)
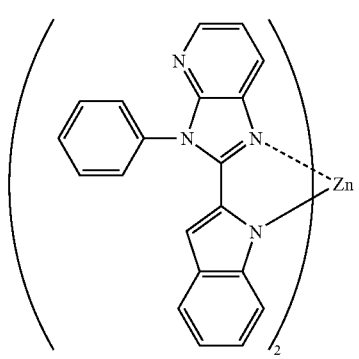 (1-56)
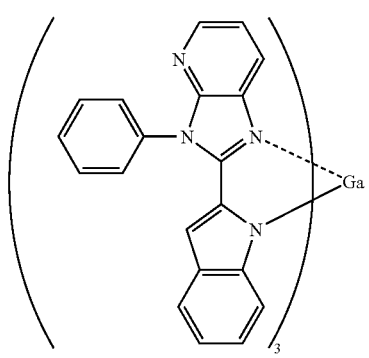 (1-57)
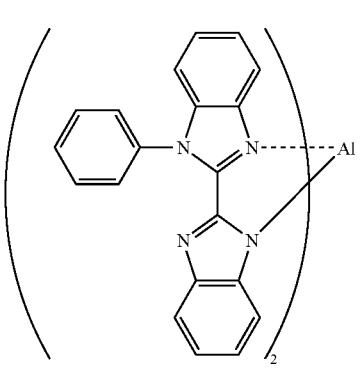 (1-60)
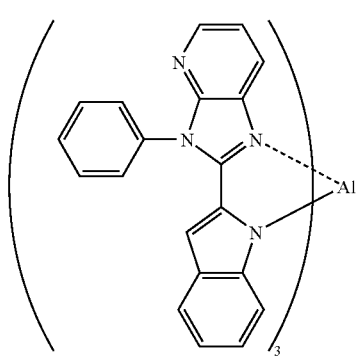 (1-58)
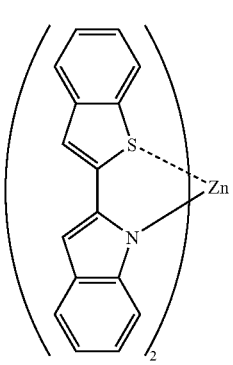 (1-61)
(1-62)

(1-63)
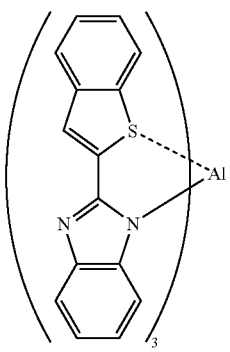
(1-67)
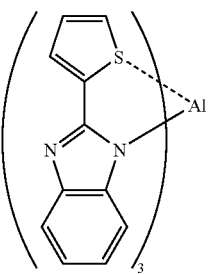
Specific but non-limiting examples of the luminescent compounds which can be used in the present invention are shown below.
(1-64)
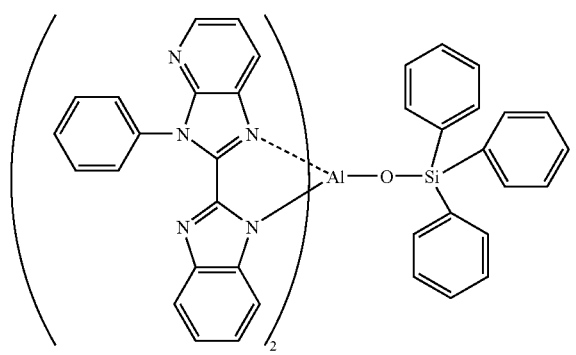
(1-65)
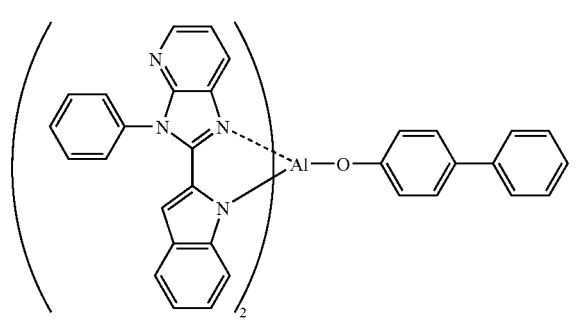
(1-66)
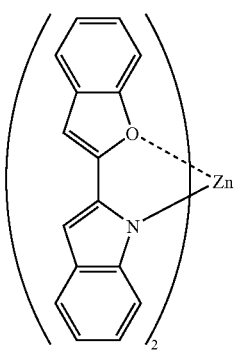
(12-1)
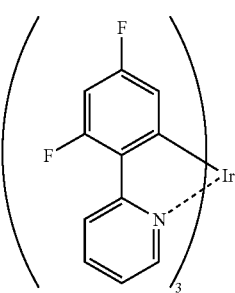
(12-2)
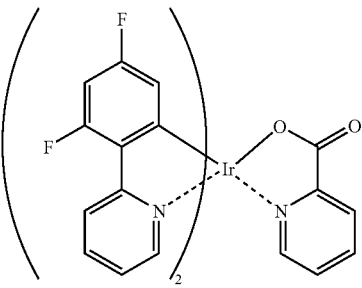
(12-3)
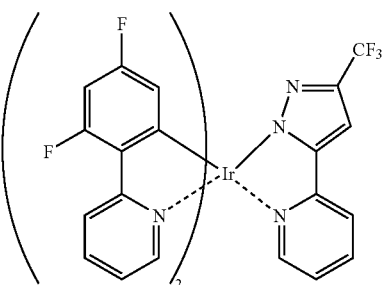
(12-4)
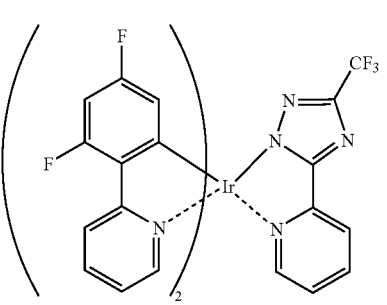

-continued

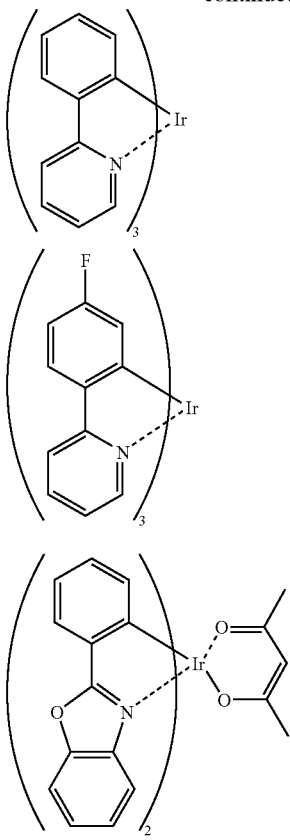

(12-7)

The compounds used in the invention can be synthesized through various processes. For example, the compounds are obtained by allowing a ligand as such or in a dissociated state and a metal compound to react with or without a solvent (e.g., halogen-containing solvents, alcohols, ethers, esters, ketones, nitrites or water) in the presence or absence of a base (either organic or inorganic, e.g., sodium methoxide, potassium t-butoxide, triethylamine or potassium carbonate) at room temperature or under heat (microwaving as well as general heating is effective).

The OELD according to the present invention is not limited by system configuration, driving mode, usage, and so forth.

The OELD of the invention preferably has a layer containing a compound having an IP of 5.9 eV or higher (particularly 6.0 eV or higher) between the cathode and the light emitting layer. It is still preferred for the OELD to have an electron transporting layer having an IP of 5.9 eV or higher between the cathode and the light emitting layer.

Methods for forming an organic compound layer include, but are not limited to, vacuum deposition by resistance heating or electron beam, sputtering, molecular accumulation, wet coating (spray coating, dip coating, impregnation, roll coating, gravure coating, reverse coating, roll brush coating, air knife coating, curtain coating, spin coating, flow coating, bar coating, microgravure coating, air doctor coating, blade coating, squeegee coating, transfer roll coating, kiss coating, casting, extrusion coating, wire bar coating, screen coating, etc.), ink jet method, printing, and transfer. From the standpoint of film characteristics and ease of production, resistance heating vacuum deposition, wet coating, and transfer are preferred.

The OELD may have a hole injecting layer, a hole transporting layer, an electron injecting layer, an electron transporting layer, a protective layer, and so forth in addition to the light emitting layer. Each of the additional layers may have functions other than the intended one meant by the designation of the layer. Each layer can be formed of various materials according to the purpose.

The light-extraction efficiency of the OELD according to the present invention can be improved by various known techniques, such as surface structuring of the substrate (for example, formation of a fine uneven pattern), controlling the refractive index of the substrate, ITO layer or organic layer (s), and controlling the thickness of the substrate, ITO layer or organic layer(s). The improvement in light-extraction efficiency leads to an increase of external quantum efficiency.

The OELD of the invention may be of a so-called top emission type, in which light is emitted from the anode side of the device.

The substrate which can be used in the OELD includes, but is not limited to, inorganic materials, such as yttrium-stabilized zirconia and glass; polyesters, such as polyethylene terephthalate, polybutylene terephthalate, and polyethylene naphthalate; and polymers, such as polyethylene, polycarbonate, polyether sulfone, polyarylate, allyl diglycol carbonate, polyimide, polycycloolefins, norbornene resins, poly(chlorotrifluoroethylene), Teflon, and tetrafluoroethylene-ethylene copolymers.

The OELD according to the present invention can be used in combination with a blue light emitting device utilizing singlet excitons for light emission.

The light emitting layer may have at least one laminate structure. The number of layers to be stacked to form the light emitting layer is preferably up to 50, still preferably 4 to 30, particularly preferably 6 to 20.

The thickness of each layer constituting the light emitting layer, while not particularly limited, is preferably 0.2 to 20 nm, still preferably 0.4 to 15 nm, particularly preferably 0.5 to 10 nm, especially preferably 1 to 5 nm.

The light emitting layer may have a plurality of domain structures. The light emitting layer may have other domain structures. The diameter of each domain is preferably 0.2 to 10 nm, still preferably 0.3 to 5 nm, particularly preferably 0.5 to 3 nm, especially preferably 0.7 to 2 nm.

The anode supplies positive holes to a hole injecting layer, a hole transporting layer, a light emitting layer, etc. Materials making up the anode include metals, alloys, metal oxides, electrically conductive compounds, and mixtures thereof. Those having a work function of 4 eV or higher are preferred. Examples of useful materials are electrically conductive metal oxides, such as tin oxide, zinc oxide, indium oxide, and indium tin oxide (ITO); metals, such as gold, silver, chromium, and nickel; mixtures or laminates of these metals and conductive metal oxides; inorganic electrically conductive substances, such as copper iodide and copper sulfide; organic electrically conductive substances, such as polyaniline, polythiophene, and polypyrrole; and mixtures or laminates of these materials and ITO. Conductive metal oxides are preferred. ITO is especially preferred for its productivity, electrical conductivity, and transparency. The thickness of the anode is decided appropriately according to the material and usually ranges from 10 nm to 5 μm, preferably 50 nm to 1 μm, still preferably 100 to 500 nm.

The anode is usually used as formed on a substrate, such as a soda lime glass plate, an alkali-free glass plate or a transparent resin plate. When a glass substrate is chosen, alkali-free glass is preferred for avoiding leaching of ions from glass. In using soda lime glass, one having a barrier coat of silica, etc. is preferred. The thickness of the substrate is not particularly limited as long as the device can maintain mechanical strength. A glass substrate, for example, usually has a thickness of 0.2 mm or larger, preferably 0.7 mm or larger.

The anode is formed by an appropriate technique selected according to the material. For instance, an ITO layer is formed by electron beam deposition, sputtering, resistance heating vacuum deposition, chemical reaction (e.g., a sol-gel process), coating with an ITO dispersion, and the like.

The anode thus formed may be subjected to cleaning or a like treatment for reducing the driving voltage or increasing luminescence efficiency. For an ITO anode, for instance, a UV-ozone treatment or a plasma treatment is effective.

The cathode supplies electrons to an electron injecting layer, an electron transporting layer, a light emitting layer, etc. The material making up the cathode is selected taking into consideration adhesion to an adjacent layer, such as an electron injecting layer, an electron transporting layer or a light emitting layer, ionizing potential, stability, and the like. Useful materials include metals, alloys, metal halides, metal oxides, electrically conductive compounds, and mixtures thereof. Examples of useful materials are alkali metals (e.g., Li, Na, and K) and fluorides or oxides thereof, alkaline earth metals (e.g., Mg and Ca) and fluorides or oxides thereof, gold, silver, lead, aluminum, sodium-potassium alloys or mixtures, lithium-aluminum alloys or mixtures, magnesium-silver alloys or mixtures, and rare earth metals (e.g., indium and ytterbium). Preferred of them are those having a work function of 4 eV or less, particularly aluminum, lithium-aluminum alloys or mixtures, and magnesium-silver alloys or mixtures. The cathode may have a single layer structure made of the above-recited material or a laminate structure containing the material. For example, an aluminum/lithium fluoride laminate or an aluminum/lithium oxide laminate is preferred. The thickness of the cathode is selected appropriately according to the material and usually ranges from 10 nm to 5 µm, preferably 50 nm to 1 µm, still preferably 100 nm to 1 µm.

The cathode can be formed by electron beam deposition, sputtering, resistance heating vacuum deposition, wet coating, transfer, and like techniques. In vacuum deposition, a single metal may be deposited, or two or more components may be deposited simultaneously. A plurality of metals may be deposited simultaneously to form an alloy cathode, or a previously formulated alloy may be deposited.

The anode and the cathode each preferably have as low sheet resistance as possible, particularly a sheet resistance lower than several hundreds of ohms per square.

In addition to the host material and the luminescent compound according to the present invention, the light emitting layer may further contain any other material as long as, with an electrical field applied, the layer performs a function of receiving holes from the anode or a hole injecting/transporting layer while receiving electrons from the cathode or an electron injecting/transporting layer, a function of transporting the injected holes or electrons, and a function of a supplying a site for allowing the holes and the electrons to be recombined thereby emitting light. The other materials the light emitting layer may contain include benzoxazole, benzimidazole, benzothiazole, styrylbenzene, polyphenyl, diphenylbutadiene, tetraphenylbutadiene, naphthylimide, coumarin, perylene, perinone, oxadiazole, aldazine, pyrralidine, cyclopentadiene, bisstyrylanthracene, quinacridone, pyrrolopyridine, thiadiazolopyridine, cyclopentadiene, styrylamine, aromatic dimethylidyne compounds; various metal complexes, such as 8-quinolinol metal complexes and rare earth complexes; polymers, such as polythiophene, polyphenylene, and polyphenylene vinylene; organosilanes; transition metal complexes, such as tris(phenylpyridine)iridium and porphyrin platinum complexes; and derivatives of these compounds. The thickness of the light emitting layer is not particularly limited and usually ranges from 1 nm to 5 µm, preferably 5 nm to 1 µm, still preferably 10 to 500 nm.

Methods of forming the light emitting layer include, but are not limited to, vacuum deposition by resistance heating or electron beam, sputtering, molecular accumulation, wet coating, ink jet method, printing, LB method, and transfer. Resistance heating vacuum deposition and wet coating are preferred.

The OLED can have one or more light emitting layers. The two or more light emitting layers may emit light of different colors to emit, for example, white light as a whole. A single light emitting layer can be designed to emit white light.

The hole injecting layer and the hole transporting layer can be of any materials having a function of injecting holes supplied by the anode, a function of transporting the holes or a function of blocking the electrons injected from the cathode. Examples of such materials include carbazole, triazole, oxazole, oxadiazole, imidazole, polyarylalkanes, pyrazoline, pyrazolone, phenylenediamine, arylamines, amino-substituted chalcones, styrylanthracene, fluorenone, hydrazone, stilbene, silazane, aromatic tertiary amine compounds, styrylamine compounds, aromatic dimethylidyne compounds, porphyrin compounds, polysilane compounds; conductive oligomers or polymers, such as poly(N-vinylcarbazole), aniline copolymers, thiophene oligomers, and polythiophene; organosilanes; carbon films; the compounds of the present invention; and derivatives of the recited compounds. The thickness of the hole injecting layer and the hole transporting layer is not particularly limited and usually ranges from 1 nm to 5 µm, preferably 5 nm to 1 µm, still preferably 10 to 500 nm. The hole injecting layer and the hole transporting layer may each have a single layer structure made of one or more of the above-recited materials or a multilayer structure composed of two or more layers having the same or different compositions.

The hole injection layer and the hole transporting layer can be formed by vacuum evaporation, LB method, wet coating with a solution or dispersion of the hole injecting/transporting material in a solvent, ink jet method, printing or transfer. Where wet coating techniques are adopted, it is possible to apply a resin component as dissolved or dispersed in the solvent together with the hole injecting/transporting material. Applicable resin components include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethyl cellulose, polyvinyl acetate, ABS resins, polyurethane, melamine resins, unsaturated polyester resins, alkyd resins, epoxy resins, and silicone resins.

The electron injecting layer and the electron transporting layer can be made of any materials that perform at least one of a function of injecting electrons from the cathode, a function of transporting the electrons, and a function of blocking positive holes from the anode. Such materials include triazole, oxazole, oxadiazole, imidazole, fluorenone, anthraquinodimethane, anthrone, diphenylquinone, thiopyran dioxide, carbodiimide, fluorenylidenemethane, distyrylpyrazine, aromatic (e.g., naphthalene or perylene)

tetracarboxylic acid anhydrides, phthalocyanine; various metal complexes, such as metal complexes of 8-quinolinol derivatives, metallo-phthalocyanines, and metal complexes having benzoxazole or benzothiazole as a ligand; organosilanes; and derivatives of the recited compounds. The thickness of the electron injecting layer and the electron transporting layer is not particularly limited and usually ranges from 1 nm to 5 μm, preferably 5 nm to 1 μm, still preferably 10 to 500 nm. The electron injecting layer and the electron transporting layer may each have a single layer structure made of one or more of the above-recited materials or a multilayer structure composed of two or more layers having the same or different compositions.

The electron injecting layer and the electron transporting layer can be formed by vacuum evaporation, LB method, wet coating with a solution or dispersion of the electron injecting/transporting material in a solvent, ink jet method, printing, transfer or like techniques. Where wet coating techniques are adopted, it is possible to apply a resin component as dissolved or dispersed in the solvent together with the hole injecting/transporting material. Applicable resin components include those described above with respect to the hole injecting/transporting layers.

The protective layer can be of any material that prevents substances which may accelerate deterioration of the device, such as moisture and oxygen, from entering the device. Such materials include metals, e.g., In, Sn, Pb, Au, Cu, Ag, Al, Ti, and Ni; metal oxides, e.g., MgO, SiO, $SiO_2$, $Al_2O_3$, GeO, NiO, CaO, BaO, $Fe_2O_3$, $Y_2O_3$, and $TiO_2$; metal fluorides, e.g., $MgF_2$, LiF, $AlF_3$, and $CaF_2$; nitrides, e.g., $SiN_x$ and $SiO_xN_y$; polyethylene, polypropylene, polymethyl methacrylate, polyimide, polyurea, polytetrafluoroethylene, polychlorotrifluoroethylene, polydichlorodifluoroethylene, chlorotrifluoroethylene-dichlorodifluoroethylene copolymers, tetrafluoroethylene copolymers, fluorine-containing copolymers having a cyclic structure in the main chain thereof; water absorbing substances having a water absorption of at least 1%; and moisture-proof substances having a water absorption of 0.1% or less.

Methods for forming the protective layer include, but are not limited to, vacuum evaporation, sputtering, reactive sputtering, molecular beam epitaxy, cluster ion beam-assisted deposition, ion plating, plasma polymerization (radiofrequency-excited ion plating), plasma-enhanced CVD, laser-assisted CVD, thermal CVD, gas source CVD, wet coating techniques, printing, and transfer.

EXAMPLES

The present invention will now be illustrated in greater detail with reference to Examples, but it should be understood that the present invention is not deemed to be limited thereto.

Comparative Example 1

N,N'-Diphenyl-N,N'-di(m-tolyl)benzidine (TPD) was deposited on a cleaned ITO substrate by vacuum evaporation to a thickness of 50 nm. Compound B shown below (compound H-12 described in JP-A-2002-305083) and compound (12-1) were vacuum co-deposited on the TPD layer at a weight ratio of 34:2 to a deposition thickness of 36 nm. Compound A shown below was vacuum deposited thereon to a thickness of 36 nm. A pattern mask (having a pattern giving a light-emitting area of 4 mm by 5 mm) was put on the thus formed organic thin film, and cathodic deposition was made (lithium fluoride was vacuum deposited to a thickness of about 1 nm, and aluminum was then vacuum deposited to a thickness of about 200 nm) to complete a device. On applying a constant DC voltage to the resulting OLED by use of Source-Measure Unit Model 2400 supplied by Toyo Corp., blue light emission was obtained. The luminance of the blue light emission was measured with a luminance meter BM-8 supplied by Topcon. As a result, $EL_{max}$ was 489 nm, and the external quantum efficiency was 2.5%.

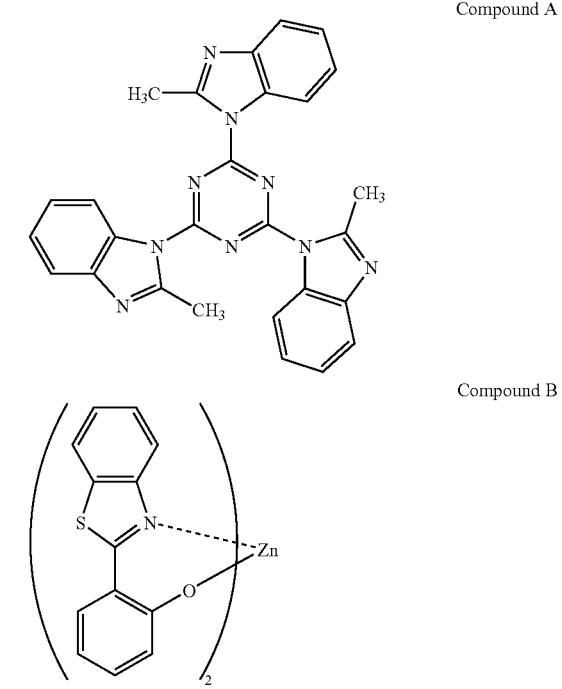

Example 1

An OELD was prepared in the same manner as in Comparative Example 1, except for replacing compound B with compound (1-1) of the present invention. As a result, the device emitted blue light having an $EL_{max}$ of 489 nm, an external quantum efficiency of 7%, and a maximum luminance of 15000 cd/m². The half decay time of an initial luminance of 1000 cd/m² was twice or more that of Comparative Example 1.

Example 2

An OELD was prepared in the same manner as in Example 1, except for replacing compound (12-1) with compound (12-3). As a result, the device emitted blue light having an $EL_{max}$ of 465 nm and an external quantum efficiency of 5%.

Example 3

Copper phthalocyanine was vacuum deposited on a cleaned ITO substrate to a deposit thickness of 10 nm. 4,4'-Bis[N-(1-napthyl)-N-phenyl-amino]biphenyl (NPD) was deposited thereon to a thickness of 50 nm. Compound (1-1), compound C shown below, and Ir(ppy)₃ were co-deposited at a weight ratio of 7:7:1 on the NPD layer.

Compound D shown below was then deposited to a thickness of 36 nm. Finally, a cathode was formed in the same manner as in Comparative Example 1 to produce an OELD. The device emitted green light having an $EL_{max}$ of 515 nm and an external quantum efficiency of 7%. The half decay time of an initial luminance of 100 cd/m² was about three times that of Comparative Example 1.

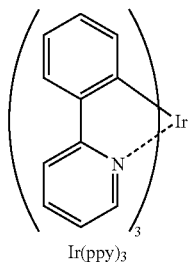

Ir(ppy)₃

Compound C

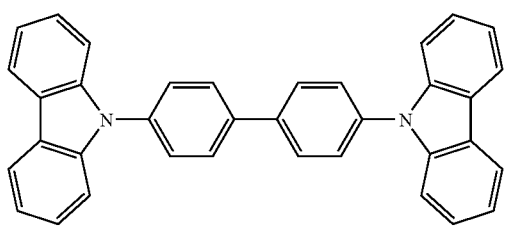

Compound D

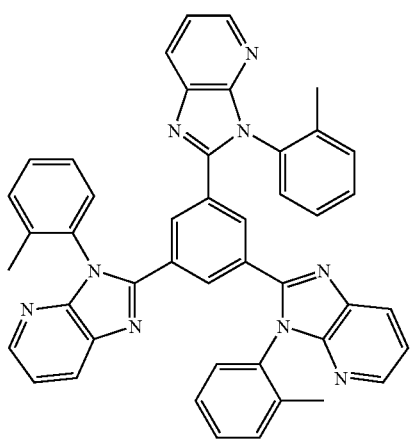

Similarly to Examples 1 and 2, OELDs achieving high luminescence efficiency were prepared by using other compounds of the present invention.

The OELD according to the present invention has a high luminance, high luminescence efficiency, and satisfactory durability. Use of a phosphorescent compound that emits light from the triplet excited state in the light emitting layer brings about increase in luminance and luminescence efficiency.

This application is based on Japanese Patent application JP 2002-382453, filed Dec. 27, 2002, the entire content of which is hereby incorporated by reference, the same as if set forth at length.

What is claimed is:

1. An organic electroluminescent device comprising:
    a pair of electrodes; and
    at least one organic compound layer between the pair of electrodes, the at least one organic compound layer including a light emitting layer,
    wherein the light emitting layer contains at least one host material and at least one luminescent material that is a phosphorescent compound that emits light via a triplet excited state, and at least one host material is a compound represented by formula (V):

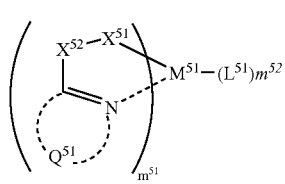

(V)

wherein $X^{51}$ represents a substituted nitrogen atom; $X^{52}$ represents a carbon atom that is present in a carbonylene group, an alkylene group or a group connected to $X^{51}$ to form a nitrogen containing-heterocyclic group; $M^{51}$ represents a metal ion; $L^{51}$ represents a ligand; $m^{51}$ represents an integer of 1 to 4; $m^{52}$ represents an integer of 0 to 6; and $Q^{51}$ represents a group necessary to form a nitrogen-containing heterocyclic ring.

2. The organic electroluminescent device of claim 1, wherein the host material and the phosphorescent compound have a $T_1$ value of 60 kcal/mol or higher, and the phosphorescent compound emits phosphorescence having a peak wavelength of 550 nm or shorter.

3. The organic electroluminescent device of claim 1, wherein the at least one organic compound layer is at least three organic compound layers including a hole transporting layer, a light emitting layer, and an electron transporting layer, and the electron transporting layer has an IP value of 5.9 eV or higher.

4. The organic electroluminescent device of claim 1, wherein the at least one host material is a compound represented by the formula (IX):

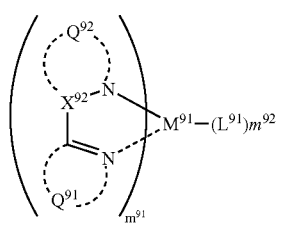

(IX)

wherein $M^{91}$ represents a metal ion; $L^{91}$ represents a ligand; $m^{91}$ represents an integer of 1 to 4; $m^{92}$ represents an integer of 0 to 6; $Q^{91}$ represents an atomic group necessary to form a nitrogen-containing heterocyclic ring; $X^{92}$ is a carbon atom; and $Q^{92}$ represents an atomic group necessary to form a nitrogen-containing heterocyclic ring.

5. The organic electroluminescent device of claim 1, wherein the at least one host material is a compound represented by the formula (XI):

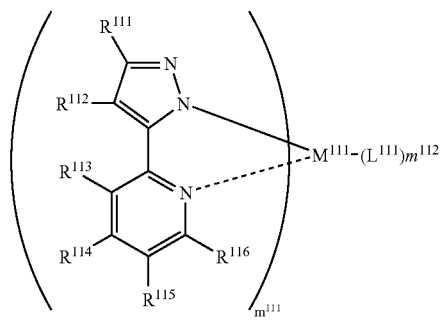

(XI)

wherein $M^{111}$ represents a metal ion; $L^{111}$ represents a ligand; $m^{111}$ represents an integer of 1 to 4; $m^{112}$ represents an integer of 0 to 6; and $R^{111}$, $R^{112}$, $R^{113}$, $R^{114}$, $R^{115}$, and $R^{116}$ each independently represent a hydrogen atom or a substituent.

6. The organic electroluminescent device of claim 1, wherein the at least one host material is at least two host materials.

7. The organic electroluminescent device of claim 6, wherein at least one of the host materials is an arylamine derivative.

8. The organic electroluminescent device of claim 6, wherein at least one of the host materials is an aromatic hydrocarbon compound.

9. The organic electroluminescent device of claim 6, wherein at least one of the host materials is an aromatic nitrogen-containing heterocyclic compound.

10. The organic electroluminescent device of claim 6, wherein at least one of the host materials is a metal complex other than the compound represented by the formula (V).

11. The organic electroluminescent device of claim 1, wherein the phosphorescent compound concentration in the light emitting layer is 0.1 to 50% by weight.

12. The organic electroluminescent device of claim 1, wherein the phosphorescent compound concentration in the light emitting layer is 0.2 to 30% by weight.

13. The organic electroluminescent device of claim 1, wherein the host material and the phosphorescent compound have a $T_1$ value of 65 kcal/mol or higher and the phosphorescent compound emits phosphorescence having a peak wavelength of 480 nm or shorter.

14. The organic electroluminescent device of claim 1, wherein the organic electroluminescent device further comprises a layer containing a compound having an IP of 5.9 eV or higher between a cathode and the light emitting layer.

15. The organic electroluminescent device of claim 1, wherein the thickness of each layer constituting the light emitting layer is 0.5 to 10 nm.

* * * * *